(12) United States Patent
Hsu et al.

(10) Patent No.: US 7,700,008 B2
(45) Date of Patent: Apr. 20, 2010

(54) BUFFER COMPOSITIONS

(75) Inventors: Che-Hsiung Hsu, Wilmington, DE (US);
Hjalti Skulason, Buellton, CA (US);
Mark T. Martello, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 48 days.

(21) Appl. No.: 11/476,487

(22) Filed: Jun. 28, 2006

(65) Prior Publication Data

US 2006/0289843 A1   Dec. 28, 2006

Related U.S. Application Data

(60) Provisional application No. 60/694,794, filed on Jun. 28, 2005.

(51) Int. Cl.
*H01B 1/12* (2006.01)
*H01B 1/02* (2006.01)

(52) U.S. Cl. .................. 252/519.33; 252/519.5; 252/520.1; 252/521.1

(58) Field of Classification Search ............ 252/519.33, 252/519.5, 520.1, 521.1
See application file for complete search history.

(56) References Cited

U.S. PATENT DOCUMENTS

| | | | |
|---|---|---|---|
| 3,282,875 | A | 11/1966 | Connolly et al. |
| 4,358,545 | A | 11/1982 | Ezzell et al. |
| 4,433,082 | A | 2/1984 | Grot |
| 4,940,525 | A | 7/1990 | Ezzell et al. |
| 5,463,005 | A | 10/1995 | Desmarteau |
| 6,150,426 | A | 11/2000 | Curtin et al. |
| 6,303,238 | B1 | 10/2001 | Thompson et al. |
| 6,670,645 | B2 | 12/2003 | Grushin et al. |
| 6,923,881 | B2 * | 8/2005 | Tateishi et al. ............. 156/240 |
| 2004/0206942 | A1 * | 10/2004 | Hsu .......................... 252/500 |
| 2004/0222413 | A1 * | 11/2004 | Hsu et al. ..................... 257/40 |
| 2005/0070654 | A1 * | 3/2005 | Hsu .......................... 524/430 |
| 2005/0205860 | A1 * | 9/2005 | Hsu et al. ..................... 257/40 |
| 2005/0209388 | A1 * | 9/2005 | Hsu et al. ................... 524/457 |
| 2005/0222333 | A1 * | 10/2005 | Hsu .......................... 525/178 |

(Continued)

FOREIGN PATENT DOCUMENTS

EP   1 026 152 B1   7/2006

(Continued)

OTHER PUBLICATIONS

U.S. Appl. No. 60/105,662, filed Oct. 25, 1999, Zhen-Yu Yang et. al.

(Continued)

*Primary Examiner*—Mark Kopec
*Assistant Examiner*—Jaison P Thomas

(57) ABSTRACT

Buffer compositions comprising semiconductive oxide particles and at least one of (a) a fluorinated acid polymer and (b) a semiconductive polymer doped with a fluorinated acid polymer are provided. Semiconductive oxide particles include metal oxides and bimetallic oxides. Acid polymers are derived from monomers or comonomers of polyolefins, polyacrylates, polymethacrylates, polyimides, polyamides, polyaramids, polyacrylamides, polystyrenes. The polymer backbone, side chains, pendant groups or combinations thereof may be fluorinated or highly fluorinated. Semiconductive polymers include polymers or copolymers derived from thiophenes, pyrroles, anilines, and polycyclic heteroaromatics. Methods for preparing buffer compositions are also provided.

2 Claims, 2 Drawing Sheets

U.S. PATENT DOCUMENTS

2005/0224765 A1* 10/2005 Hsu et al. ............... 252/500
2006/0180810 A1* 8/2006 Lee et al. ................ 257/40

FOREIGN PATENT DOCUMENTS

| WO | WO 98/31716 | A1 | 7/1998 |
|---|---|---|---|
| WO | WO 99/52954 | A1 | 10/1999 |
| WO | WO 00/70655 | A2 | 11/2000 |
| WO | WO 01/41512 | A1 | 6/2001 |
| WO | WO 03/006537 | A1 | 1/2003 |
| WO | WO 03/008424 | A1 | 1/2003 |
| WO | WO 03/040257 | A1 | 5/2003 |
| WO | WO 03/063555 | A1 | 7/2003 |
| WO | WO 03/091688 | A2 | 11/2003 |
| WO | WO 2004/016710 | A1 | 2/2004 |

OTHER PUBLICATIONS

U.S. Appl. No. 60/176,881, filed Jan. 19, 2000, Jose M. Rodriguez Parada.

Wu et. al., Transparent, Conductive Carbon Nanotube Films, Science, 2004, vol. 305:1273-1276.

Lee et. al., Poly(thieno{3,4-b}thiophene). A New Stable Low Band Gap Conducting Polymer, Macromolecules, 2001, vol. 34:5746-5747.

Sotzing et. al., Poly{3,4-b}thiophene): A p- and n-Dopable Polythiophene Exhibiting High Optical Transparency in the Semiconducting State, Macromolecules, 2002, vol. 35:7281-7286.

A. Feiring et. al., Aromatic Monomers With Pendant Fluoroalkylsulfonate and Sulfonimide Groups J. Fluorine Chemistry, 2000, vol. 105:129-135.

Feiring et. al., Novel Aromatic Polymers With Pendant Lithium Perfluoroalkylsulfonate of Sulfonimide Groups, Macromolecules, 2000, vol. 33:9262-9271.

D. Desmarteau, Novel Perfluorinated Ionomers and Ionenes, J. Fluorine Chem., 1995, vol. 72:203-208.

A.J. Appleby et. al., Polymeric Perfluoro Bis-Sulfonimides as Possible Fuel Cell Electrolytes J. Electrochem. Soc., 1993, vol. 140:109-111.

G. Gustafsson et. al., Flexible Light-Emitting Diodes Made From Soluble Conducting Polymers, Nature, 1992, vol. 357:477-479.

Y. Wang, Photoconductive Polymers, Kirk-Othmer Encyclopedia of Chemical Technology, Fourth Edition, 1999, vol. 18:837-860.

PCT International Search Report and Written Opinion for International Application No. PCT/US06/25138 dated Feb. 29, 2008.

* cited by examiner

BUFFER COMPOSITIONS

RELATED U.S. APPLICATIONS

This application claims priority to U.S. provisional application, Ser. No. 60/694,794, filed Jun. 28, 2005.

BACKGROUND INFORMATION

1. Field of the Disclosure

This disclosure relates in general to high work function transparent conductors for use in electronic devices.

2. Description of the Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs containing conducting polymers can have the following configuration:

anode/buffer layer/EL material/cathode

Additional, optional layers, materials or components may be incorporated into this general configuration. The anode is typically any material that has the ability to inject holes into the electroluminescent ("EL") material, such as, for example, indium/tin oxide (ITO). The anode is optionally supported on a glass or plastic substrate. The buffer layer is typically an electrically conducting polymer and facilitates the injection of holes from the anode into the EL material layer. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. At least one of the anode or cathode is transparent or semi-transparent to allow for light emission.

ITO is frequently used as the transparent anode. However, the work function of ITO is relatively low, typically in the range of 4.6 eV. This results in less effective injection of holes into the EL material. In some cases, the work function of ITO can be improved by surface treatment. However, these treatments sometime result in products that are not stable and further result in reduced device lifetime.

Accordingly, there is a need for compositions and layers prepared therefrom to improve the properties of the device.

SUMMARY

There is provided a buffer composition comprising semiconductive oxide particles and at least one of (a) a fluorinated acid polymer and (b) a semiconductive polymer doped with a fluorinated acid polymer.

In another embodiment, there is provided a buffer layer made from the new buffer composition.

In another embodiment, there is provided an electronic device comprising the buffer layer.

The foregoing general description and the following detailed description are exemplary and explanatory and are not restrictive of the invention, as defined in the specification and appended claims.

BRIEF DESCRIPTION OF THE DRAWINGS

The invention is illustrated by way of example and not limitation in the accompanying figures.

Figure 1:
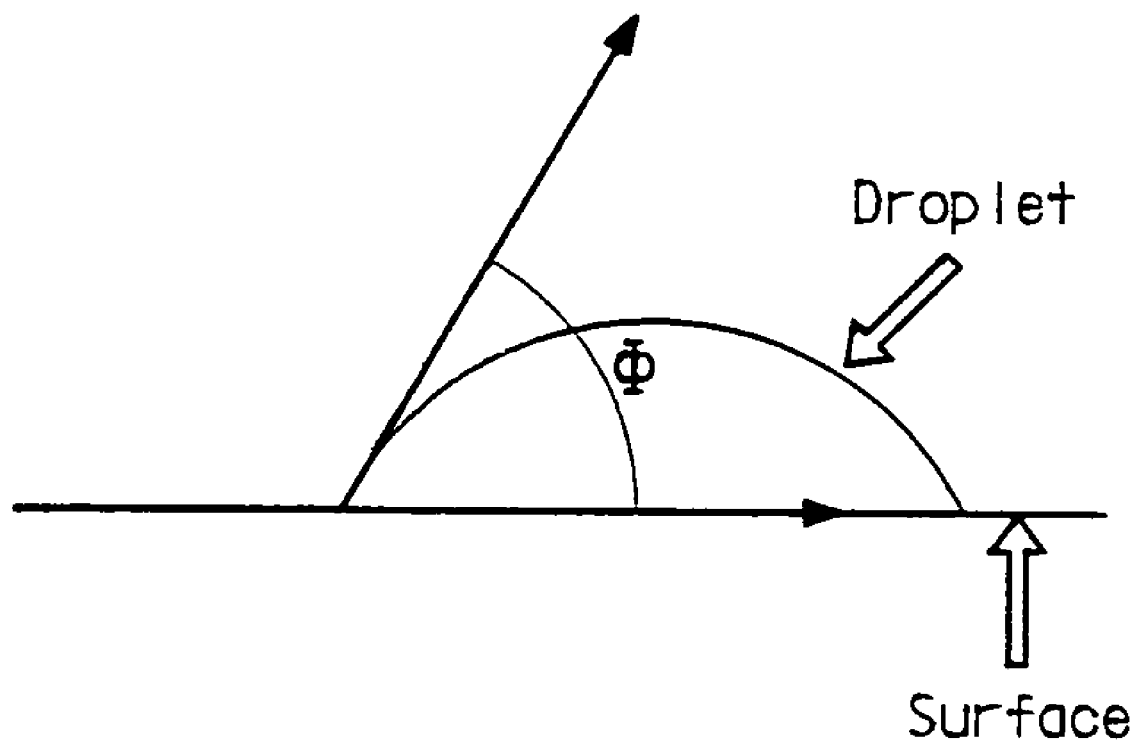
FIG. 1 is a diagram illustrating contact angle.

Skilled artisans appreciate that objects in the figures are illustrated for simplicity and clarity and have not necessarily been drawn to scale. For example, the dimensions of some of the objects in the figures may be magnified relative to other objects to help to improve understanding of embodiments.

DETAILED DESCRIPTION

There is provided a buffer composition comprising semiconductive oxide particles and at least one of (a) a fluorinated acid polymer and (b) a semiconductive polymer doped with a fluorinated acid polymer.

Many aspects and embodiments are described herein and are exemplary and not limiting. After reading this specification, skilled artisans will appreciate that other aspects and embodiments are possible without departing from the scope of the invention.

As used herein, the term "semiconductive" refers to material having electrical conductivity greater than insulators but less than good conductors. In one embodiment, a film of a semiconductive material has a conductivity of less than 0.1 S/cm and greater than $10^{-8}$ S/cm. The term "fluorinated acid polymer" refers to a polymer having acidic groups, where at least some of the hydrogens have been replaced by fluorine. Fluorination can occur on the polymer backbone, on side chains attached to the backbone, in pendant groups, or in combinations of these. The term "acidic group" refers to a group capable of ionizing to donate a hydrogen ion to a base to form a salt. As used herein, the term "semiconductive polymer" refers to any polymer or oligomer which is inherently or intrinsically capable of electrical conductivity without the addition of carbon black or conductive metal particles. The term "polymer" encompasses homopolymers and copolymers. The term "doped" is intended to mean that the semiconductive polymer has a polymeric counterion derived from a polymeric acid to balance the charge on the conductive polymer.

1. Semiconductive Oxide Particles

In one embodiment, semiconductive oxide materials comprise an oxide of an element selected from group 2 through group 12 of the periodic table. In one embodiment, semiconductive oxide materials comprise an oxide of an element selected from group 2 and group 12. Group numbers corresponding to columns within the periodic table of the elements use the "New Notation" convention as seen in the *CRC Handbook of Chemistry and Physics*, $81^{st}$ Edition (2000), where the groups are numbered from left to right as 1-18.

In one embodiment, the inorganic semiconductive material is an inorganic oxide which may be a bimetallic oxide, such as $Ni_xCo_{x-1}O_{3/4}$ (Science, p 1273-1276, vol 305, Aug. 27, 2004), indium-tin oxide ("ITO"), indium-zinc oxide ("IZO"), gallium-indium oxide, zinc-antimony double oxide and zirconium, or antimony doped oxide.

2. Semiconductive Polymer

Any semiconductive polymer can be used in the new composition. In one embodiment, the semiconductive polymer will form a film which has a conductivity of at least $10^{-7}$ S/cm. The conductive polymers suitable for the new composition can be homopolymers, or they can be copolymers of two or more respective monomers. The monomer from which the conductive polymer is formed, is referred to as a "precursor monomer". A copolymer will have more than one precursor monomer.

In one embodiment, the semiconductive polymer is made from at least one precursor monomer selected from thiophenes, pyrroles, anilines, and polycyclic aromatics. The polymers made from these monomers are referred to herein as polythiophenes, polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring.

In one embodiment, thiophene monomers contemplated for use to form the semiconductive polymer comprise Formula I below:

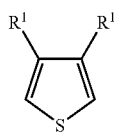

(I)

wherein:
R¹ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both R¹ groups together may form an alkylene or alkenylene chain completing a 3, 4, 5, 6, or 7-membered aromatic or alicyclic ring, which ring may optionally include one or more divalent nitrogen, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —R³—OH |
| "amido" | —R³—C(O)N(R⁶) R⁶ |
| "amidosulfonate" | —R³—C(O)N(R⁶) R⁴—SO₃Z |
| "benzyl" | —CH₂—C₆H₅ |
| "carboxylate" | —R³—C(O)O—Z or —R³—O—C(O)—Z |
| "ether" | —R³—(O—R⁵)ₚ—O—R⁵ |

-continued

| | |
|---|---|
| "ether carboxylate" | —R³—O—R⁴—C(O)O—Z or —R³—O—R⁴—O—C(O)—Z |
| "ether sulfonate" | —R³—O—R⁴—SO₃Z |
| "ester sulfonate" | —R³—O—C(O)—R⁴—SO₃Z |
| "sulfonimide" | —R³—SO₂—NH—SO₂—R⁵ |
| "urethane" | —R³—O—C(O)—N(R⁶)₂ | where all "R" groups are the same or different at each occurrence and:
R³ is a single bond or an alkylene group
R⁴ is an alkylene group
R⁵ is an alkyl group
R⁶ is hydrogen or an alkyl group
p is 0 or an integer from 1 to 20
Z is H, alkali metal, alkaline earth metal, N(R⁵)₄ or R⁵

Any of the above groups may further be unsubstituted or substituted, and any group may have F substituted for one or more hydrogens, including perfluorinated groups. In one embodiment, the alkyl and alkylene groups have from 1-20 carbon atoms.

In one embodiment, in the thiophene monomer, both R¹ together form —O—(CHY)ₘ—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the thiophene monomer has Formula I(a):

(Ia)

wherein:
R⁷ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one R⁷ is not hydrogen, and
m is 2 or 3.

In one embodiment of Formula I(a), m is two, one R⁷ is an alkyl group of more than 5 carbon atoms, and all other R⁷ are hydrogen. In one embodiment of Formula I(a), at least one R⁷ group is fluorinated. In one embodiment, at least one R⁷ group has at least one fluorine substituent. In one embodiment, the R⁷ group is fully fluorinated.

In one embodiment of Formula I(a), the R⁷ substituents on the fused alicyclic ring on the thiophene offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene (—$CH_2$—O—C(O)—$CF_2$—$SO_3H$), and all other $R^7$ are hydrogen.

In one embodiment, pyrrole monomers contemplated for use to form the semiconductive polymer comprise Formula II below.

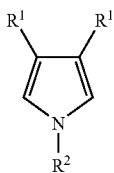

(II)

where in Formula II:
  $R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and
  $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—(CHY)$_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the semiconductive polymer comprise Formula III below.

(III)

wherein:
  a is 0 or an integer from 1 to 4;
  b is an integer from 1 to 5, with the proviso that a+b=5; and
  $R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

IV(a)

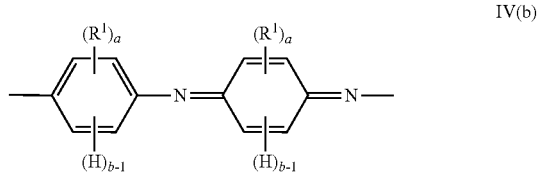

IV(b)

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycylic heteroaromatic monomers contemplated for use to form the semiconductive polymer have two or more fused aromatic rings, at least one of which is heteroaromatic. In one embodiment, the fused polycyclic heteroaromatic monomer has Formula V:

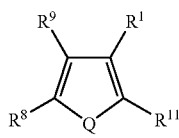

(V)

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur or oxygen atoms.

In one embodiment, the fused polycyclic heteroaromatic monomer has Formula V(a), V(b), V(c), V(d), V(e), V(f), and V(g):

(Va)

(Vb)

(Vc)

(Vd)

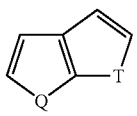

(Ve)

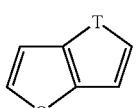

(Vf)

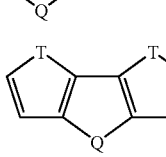

(Vg)

wherein:

Q is S, Se, Te, or NH; and

T is the same or different at each occurrence and is selected from S, $NR^6$, O, $SiR^6_2$, Se, Te, and $PR^6$;

$R^6$ is hydrogen or alkyl.

The fused polycyclic heteroaromatic monomers may be substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene) monomer is substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the copolymer in the new composition comprise Formula VI:

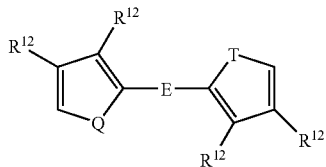

(VI)

wherein:

Q is S, Se, Te, or $NR^6$;

T is selected from S, $NR^6$, O, $SiR^6_2$, Se, Te, and $PR^6$;

E is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the semiconductive polymer is a copolymer of a first precursor monomer and at least one second precursor monomer. Any type of second monomer can be used, so long as it does not detrimentally affect the desired properties of the copolymer. In one embodiment, the second monomer comprises no more than 50% of the copolymer, based on the total number of monomer units. In one embodiment, the second monomer comprises no more than 30%, based on the total number of monomer units. In one embodiment, the second monomer comprises no more than 10%, based on the total number of monomer units.

Exemplary types of second precursor monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent first precursor monomers, which can be the same or different, and B represents a second precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the semiconductive polymer is a copolymer of two or more precursor monomers. In one embodiment, the precursor monomers are selected from a thiophene, a pyrrole, an aniline, and a polycyclic aromatic.

3. Fluorinated Acid Polymer

The fluorinated acid polymer (hereinafter referred to as "FAP") can be any polymer which is fluorinated and has acidic groups. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the avialable hydrogens bonded to a carbon, have been replaced with fluorine. The term "acidic group" refers to a group capable of ionizing to donate a hydrogen ion to a Brønsted base to form a salt. The acidic groups supply an ionizable proton. In one embodiment, the acidic group has a pKa of less than 3. In one embodiment, the acidic group has a pKa of less than 0. In one embodiment, the acidic group has a pKa of less than −5. The acidic group can be attached directly to the polymer backbone, or it can be attached to side chains on the polymer backbone or pendant groups. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the FAP is organic solvent wettable ("wettable FAP"). The term "organic solvent wettable" refers to a material which, when formed into a film, is wettable by organic solvents. The term also includes polymeric acids which are not film-forming alone, but which when doped into a semiconductive polymer will form a film which is wettable. In one embodiment, the organic solvent wettable material forms a film which is wettable by phenylhexane with a contact angle less than 40°.

In one embodiment, the FAP is organic solvent non-wettable ("non-wettable FAP"). The term "organic solvent non-wettable" refers to a material which, when formed into a film, is not wettable by organic solvents. The term also includes polymeric acids which are not film-forming alone, but which when doped into a semiconductive polymer will form a film which is non-wettable. In one embodiment, the organic solvent non-wettable material forms a film on which phenylhexane has a contact angle greater than 40°.

As used herein, the term "contact angle" is intended to mean the angle φ shown in FIG. 1. For a droplet of liquid medium, angle φ is defined by the intersection of the plane of the surface and a line from the outer edge of the droplet to the surface. Furthermore, angle φ is measured after the droplet has reached an equilibrium position on the surface after being applied, i.e., "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the FAP is water-soluble. In one embodiment, the FAP is dispersible in water. In one embodiment, the FAP forms a colloidal dispersion in water.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonimide groups. In one embodiment, the acidic groups are on a fluorinated side chain. In one embodiment, the fluorinated side chains are selected from alkyl groups, alkoxy groups, amido groups, ether groups, and combinations thereof.

In one embodiment, the wettable FAP has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl) allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the wettable FAP is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the wettable FAP is a homopolymer or copolymer of monomers having Formula VII:

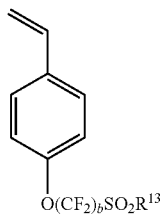

(VII)

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or SFSI" shown below:

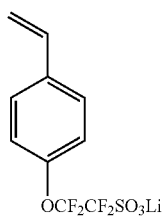

SFS

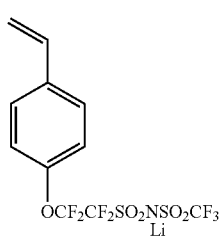

SFSI

After polymerization, the polymer can be converted to the acid form.

In one embodiment, the wettable FAP is a homopolymer or copolymer of a trifluorostyrene having acidic groups. In one embodiment, the trifluorostyrene monomer has Formula VIII:

(VIII)

where:
W is selected from $(CF_2)_q$, $O(CF_2)_q$, $S(CF_2)_q$, $(CF_2)_qO(CF_2)_r$, and $SO_2(CF_2)_q$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer containing W equal to $S(CF_2)_q$ is polymerized then oxidized to give the polymer containing W equal to $SO_2(CF_2)_q$. In one embodiment, the polymer containing $R^{13}$ equal to F is converted its acid form where $R^{13}$ is equal to OH or $NHR^{14}$.

In one embodiment, the wettable FAP is a sulfonimide polymer having Formula IX:

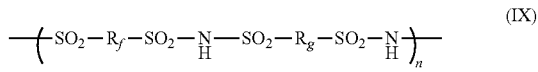

(IX)

where:
$R_f$ is selected from fluorinated alkylene, fluorinated heteroalkylene, fluorinated arylene, or fluorinated heteroarylene;
$R_g$ is selected from fluorinated alkylene, fluorinated heteroalkylene, fluorinated arylene, fluorinated heteroarylene, arylene, or heteroarylene; and
n is at least 4.

In one embodiment of Formula IX, $R_f$ and $R_g$ are perfluoroalkylene groups. In one embodiment, $R_f$ and $R_g$ are perfluorobutylene groups. In one embodiment, $R_f$ and $R_g$ contain ether oxygens. In one embodiment, n is greater than 20.

In one embodiment, the wettable FAP comprises a fluorinated polymer backbone including a side chain having Formula X:

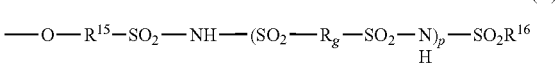

(X)

where:
$R_g$ is selected from fluorinated alkylene, fluorinated heteroalkylene, fluorinated arylene, fluorinated heteroarylene, arylene, or heteroarylene;
$R^{15}$ is a fluorinated alkylene group or a fluorinated heteroalkylene group;
$R^{16}$ is a fluorinated alkyl or a fluorinated aryl group; and
p is 0 or an integer from 1 to 4.

In one embodiment, the wettable FAP has Formula XI:

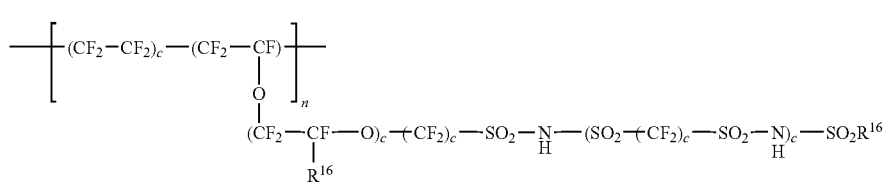

(XI)

where:
R$^{16}$ is a fluorinated alkyl or a fluorinated aryl group;
a, b, c, d, and e are each independently 0 or an integer from 1 to 4; and
n is at least 4.

The synthesis of these fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the wettable FAP comprises at least one repeat unit derived from an ethylenically unsaturated compound having Formula XII:

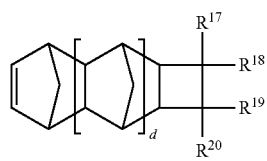

(XII)

wherein d is 0, 1, or 2;
R$^{17}$ to R$^{20}$ are independently H, halogen, alkyl or alkoxy of 1 to 10 carbon atoms, Y, C(R$_f'$)(R$_f'$)OR$^{21}$, R$^4$Y or OR$^4$Y;
Y is COE$^2$, SO$_2$ E$^2$, or sulfonimide;
R$^{21}$ is hydrogen or an acid-labile protecting group;
R$_f'$ is the same or different at each occurrence and is a fluoroalkyl group of 1 to 10 carbon atoms, or taken together are (CF$_2$)$_e$ where e is 2 to 10;
R$^4$ is an alkylene group;
E$^2$ is OH, halogen, or OR$^7$; and
R$^5$ is an alkyl group;
with the proviso that at least one of R$^{17}$ to R$^{20}$ is Y, R$^4$Y or OR$^4$Y.

R$^4$, R$^5$, and R$^{17}$ to R$^{20}$ may optionally be substituted by halogen or ether oxygen.

Some illustrative, but nonlimiting, examples of representative monomers of Formula XII are presented below:

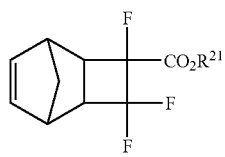

(XIIa)

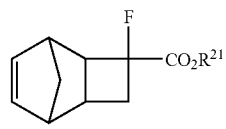

(XIIb)

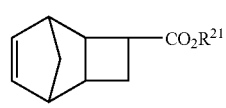

(XIIc)

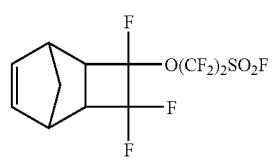

(XIId)

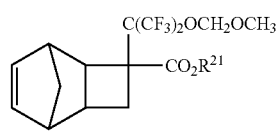

(XIIe)

wherein R$^{21}$ is a group capable of forming or rearranging to a tertiary cation, more typically an alkyl group of 1 to 20 carbon atoms, and most typically t-butyl.

Compounds of Formula XII wherein d=0, (e.g., Formula XII-a), may be prepared by cycloaddition reaction of unsaturated compounds of structure (XIII) with quadricyclane (tetracyclo[2.2.1.0$^{2,6}$0$^{3,5}$]heptane) as shown in the equation below.

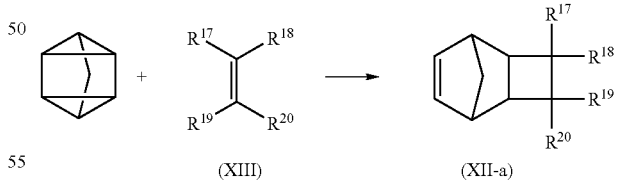

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of Formula XII with higher values of d (i.e., d=1 or 2) may be prepared by reaction of compounds of structure (XII) with d=0 with cyclopentadiene, as is known in the art.

In one embodiment, the wettable FAP is a copolymer which also comprises a repeat unit derived from at least one fluoroolefin, which is an ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the non-wettable FAP comprises a polymeric backbone having pendant groups comprising siloxane sulfonic acid. In one embodiment, the siloxane pendant groups have the formula below:

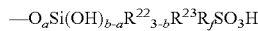

$$-O_aSi(OH)_{b-a}R^{22}_{3-b}R^{23}R_fSO_3H$$

wherein:
a is from 1 to b;
b is from 1 to 3;
$R^{22}$ is a non-hydrolyzable group independently selected from the group consisting of alkyl, aryl, and arylalkyl;
$R^{23}$ is a bidentate alkylene radical, which may be substituted by one or more ether oxygen atoms, with the proviso that $R^{23}$ has at least two carbon atoms linearly disposed between Si and $R_f$; and
$R_f$ is a perfluoralkylene radical, which may be substituted by one or more ether oxygen atoms.

In one embodiment, the non-wettable FAP having pendant siloxane groups has a fluorinated backbone. In one embodiment, the backbone is perfluorinated.

In one embodiment, the non-wettable FAP has a fluorinated backbone and pendant groups represented by the Formula (XIV)

$$-O_g-[CF(R_f^2)CF-O_h]_i-CF_2CF_2SO_3H \qquad (XIV)$$

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the non-wettable FAP has formula (XV)

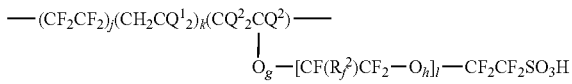

$$-(CF_2CF_2)_j(CH_2CQ^1_2)_k(CQ^2_2CQ^2)-$$
$$\qquad \qquad \qquad | $$
$$\qquad O_g-[CF(R_f^2)CF_2-O_h]_i-CF_2CF_2SO_3H$$

(XV)

where $j\geq 0$, $k\geq 0$ and $4\leq(j+k)\leq 199$, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1, and $E^4$ is H or an alkali metal. In one embodiment $R_f^2$ is $-CF_3$, g=1, h=1, and i=1. In one embodiment the pendant group is present at a concentration of 3-10 mol-%.

In one embodiment, $Q^1$ is H, $k\geq 0$, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and i-1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954(A1), and 60/176,881.

In one embodiment, the non-wettable FAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the non-wettable colloid-forming FAP. is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula $-SO_3E^5$ where $E^5$ is a cation, also known as a "counterion". $E^5$ may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counterions, represented generally as $M^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group ($-SO_2F$), which can be subsequently hydrolyzed to a sulfonate functional group. For example, copolymers of a first fluorinated vinyl monomer together with a second fluorinated vinyl monomer having a sulfonyl fluoride group ($-SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and $R-CH=CH_2$ where R is a perfluorinated alkyl group of 1 to 10 carbon atoms, can be incorporated into these polymers if desired. The polymers may be of the type referred to herein as random copolymers, that is, copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present invention include a highly fluorinated, and in one embodiment perfluorinated, carbon backbone and side chains represented by the formula

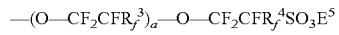

wherein $R_f^3$ and $R_f^4$ are independently selected from F, Cl or a perfluorinated alkyl group having 1 to 10 carbon atoms, a=0, 1 or 2, and $E^5$ is H, Li, Na, K or N(R1)(R2)(R3)(R4) and R1, R2, R3, and R4 are the same or different and are and in one embodiment H, $CH_3$ or $C_2H_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

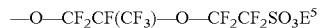

where X is as defined above. FSA polymers of this type are disclosed in U.S. Pat. No. 3,282,875 and can be made by copolymerization of tetrafluoroethylene (TFE) and the perfluorinated vinyl ether $CF_2=CF-O-CF_2CF(CF_3)-O-CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain $-O-CF_2CF_2SO_3E^5$, wherein $E^5$ is as defined above. This polymer can be made by copolymerization of tetrafluoroethylene (TFE) and the perfluorinated vinyl ether $CF_2=CF-O-CF_2CF_2SO_2F$, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment from about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is $-O-CF_2-CF(CF_3)-O-CF_2-CF_2-SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain $-O-CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, the concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commerically as Nafion® dispersions, from E.I. du Pont de Nemours and Company (Wilmington, Del.).

4. Preparing Doped Semiconductive Polymers

In one embodiment, the doped semiconductive polymers are formed by oxidative polymerization of the precursor monomer in the presence of at least one FAP. The doped semiconductive polymers are abbreviated hereinafter as "SCP/FAP". The polymerization is generally carried out in a homogeneous aqeuous solution. In another embodiment, the polymerization for obtaining the electrically conducting polymer is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the doped semiconductive polymer.

In one embodiment, the method of making an aqueous dispersion of the semiconductive polymer doped with FAP includes forming a reaction mixture by combining water, at least one precursor monomer, at least one FAP, and an oxidizing agent, in any order, provided that at least a portion of the FAP is present when at least one of the precursor monomer and the oxidizing agent is added. It will be understood that, in the case of semiconductive copolymers, the term "at least one precursor monomer" encompasses more than one type of monomer.

In one embodiment, the method of making an aqueous dispersion of the doped semiconductive polymer includes forming a reaction mixture by combining water, at least one precursor monomer, at least one FAP, and an oxidizing agent, in any order, provided that at least a portion of the FAP is present when at least one of the precursor monomer and the oxidizing agent is added.

In one embodiment, the method of making the doped semiconductive polymer comprises:
(a) providing an aqueous solution or dispersion of a FAP;
(b) adding an oxidizer to the solutions or dispersion of step (a); and
(c) adding at least one precursor monomer to the mixture of step (b).

In another embodiment, the precursor monomer is added to the aqueous solution or dispersion of the FAP prior to adding the oxidizer. Step (b) above, which is adding oxidizing agent, is then carried out.

In another embodiment, a mixture of water and the precursor monomer is formed, in a concentration typically in the range of from about 0.5% by weight to about 4.0% by weight total precursor monomer. This precursor monomer mixture is added to the aqueous solution or dispersion of the FAP, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitrites, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the fluorinated acid polymer, and the oxidizer is added last. In one embodiment the co-acid is added prior to the addition of the precursor monomers, followed by the addition of the fluorinated acid polymer, and the oxidizer is added last.

In one embodiment, the polymerization is carried out in the presence of both a co-dispersing liquid and a co-acid.

In the method of making the doped semiconductive polymer, the molar ratio of oxidizer to total precursor monomer is generally in the range of 0.1 to 3.0; and in one embodiment is 0.4 to 1.5. The molar ratio of FAP to total precursor monomer is generally in the range of from 0.2 to 10. In one embodiment, the ratio is in the range of 1 to 5. The overall solid content is generally in the range of about 0.5% to 12% in weight percentage; and in one embodiment of about 2% to 6%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

(a) pH Treatment

As synthesized, the aqueous dispersions of the doped semiconductive polymers generally have a very low pH. When the semiconductive polymer is doped with a FAP, it has been found that the pH can be adjusted to higher values, without adversely affecting the properties in devices. In one embodiment, the pH of the dispersion can be adjusted to about 1.5 to about 4. In one embodiment, the pH is adjusted to between 2 and 3. It has been found that the pH can be adjusted using known techniques, for example, ion exchange or by titration with an aqueous basic solution.

In one embodiment, the as-formed aqueous dispersion of FAP-doped semiconductive polymer is contacted with at least one ion exchange resin under conditions suitable to remove any remaining decomposed species, side reaction products, and unreacted monomers, and to adjust pH, thus producing a stable, aqueous dispersion with a desired pH. In one embodiment, the as-formed doped semiconductive polymer dispersion is contacted with a first ion exchange resin and a second ion exchange resin, in any order. The as-formed doped semiconductive polymer dispersion can be treated with both the first and second ion exchange resins simultaneously, or it can be treated sequentially with one and then the other. In one embodiment, the two doped semiconductive polymers are combined as-synthesized, and then treated with one or more ion exchange resins.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-formed aqueous dispersion either simultaneously, or consecutively. For example, in one embodiment both resins are added simultaneously to an as-formed aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-formed aqueous dispersion. Moreover, the basic, anion exchange and/or acidic, cation exchange resins renders the acidic sites more basic, resulting in increased pH of the dispersion. In general, about one to five grams of ion exchange resin is used per gram of semiconductive polymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

5. Preparing Buffer Compositions

The new buffer compositions can be formed by blending the semiconductive oxide particles with the FAP or the SCP/FAP. This can be accomplished by adding an aqueous dispersion of the semiconductive oxide particles to an aqueous dispersion of the FAP or the SCP/FAP. In one embodiment, the composition is further treated using sonication or microfluidization to ensure mixing of the components.

In one embodiment, one or both of the components are isolated in solid form. The solid material can be redispersed in water or in an aqueous solution or dispersion of the other component. For example, semiconductive oxide particle solids can be dispersed in an aqueous solution or dispersion of a semiconductive polymer doped with an FAP.

6. Buffer Layers

In another embodiment of the invention, there are provided buffer layers deposited from aqueous dispersions comprising the new buffer compositions. The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. The term "layer" is used interchangeably with the term "film" and refers to a coating covering a desired area. The sense of the term is not limited or qualified by considerations of the size of a coated area. The area can be as large as an entire device or as small as a specific functional area such as the actual visual display, or as small as a single sub-pixel.

In one embodiment, the buffer layer is formed using a liquid deposition method. Any liquid deposition method can be used. Continuous liquid deposition techniques, inlcude but are not limited to, spin coating, gravure coating, curtain coating, dip coating, slot-die coating, spray coating, and continuous nozzle coating. Discontinuous liquid deposition techniques include, but are not limited to, ink jet printing, gravure printing, and screen printing.

In another embodiment, there are provided buffer layers deposited from aqueous dispersions comprising the new conductive polymer composition blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers. Examples of suitable polymers include, but are not limited to, conductive polymers such as polythiophenes, polyanilines, polypyrroles, polyacetylenes, and combinations thereof.

7. Electronic Devices

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

Figure 2:
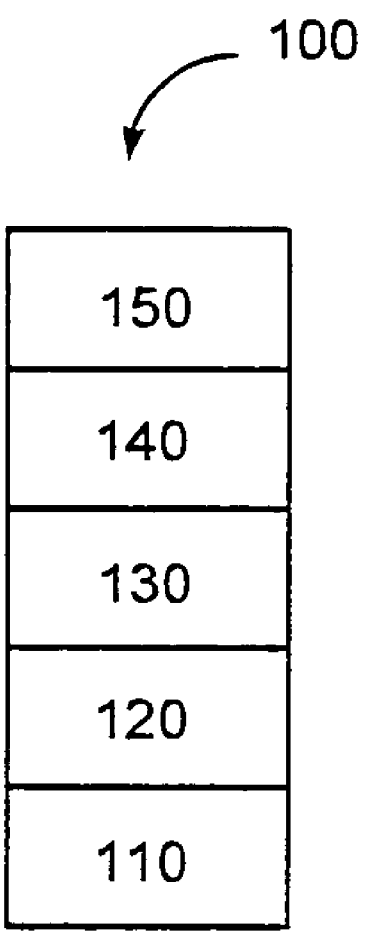
FIG. 2 is a schematic diagram of an organic electronic device.

As shown in FIG. 2, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 is usually deposited onto substrates using a variety of techniques well-known to those skilled in the art. Typical deposition techniques, as discussed above, include liquid deposition (continuous and discontinuous techniques), and thermal transfer.

An optional layer, not shown, may be present between the buffer layer 120 and the electroactive layer 130. This layer may comprise hole transport materials. Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N, N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly(9,9,-dioctylfluorene-co-N-(4-butylphenyl)diphenylaminer), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAlQ), tetra(8-hydroxyquinolato)zirconium (ZrQ), and tris(8-hydroxyquinolato)aluminum (Alq$_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2, 4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110).

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the buffer layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In various embodiments, the different layers have the following ranges of thicknesses: anode 110, 500-5000 Å, in one embodiment 1000-2000 Å; buffer layer 120, 50-2000 Å, in one embodiment 200-1000 Å; optional transport layer, 50-2000 Å, in one embodiment 100-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the term "layer" is used interchangeably with the term "film" and refers to a coating covering a desired area. The meaning is not affected by the size of the area coated. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, inlcude but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "work function" is intended to mean the minimum energy needed to remove an electron from a material to a point at infinite distance away from the surface.

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

Example 1

This example illustrates preparation of an aqueous dispersion of antimony double oxide with Nafion®, and conductivity of the film spin-coated from the dispersion. Nafion® is a trade name for poly(perfluoroethylene sulfonic acid) from E.I. du Pont de Nemours and Company (Wilmington, Del.):

In this example, Celnax CX-Z300H purchased from Nissan Chemical Industries, LTD from Houston, Tex. The Celnax is antimony double oxide hydrosol, which contains 30% (w/w) oxide and about 70% water. It has pH 6.9 and particle size of 20 nm using BET method. Thin layer of dried film of the material is bluish green color and almost transparent. 2.0112 g of Celnax was first diluted with 4.9748 g de-ionized water. 1.632 g Nafion® dispersion, which contains 12.23% (w/w) Nafion® polymer, was then added to the diluted Celnax dispersion. They mixed easily and formed a stable dispersion without a sign of sedimentation.

A couple of drops of the dispersion were placed on a microscope slide to form a thin, transparent film. The thin film was painted with silver paste to form two parallel lines as electrodes for measurement of resistance. The resistance was converted to conductivity by taking a thickness of the film and separating the two electrodes along the length of the electrodes. Conductivity was determined to be $8 \times 10^4$ S/cm. This conductivity is suitable as a buffer layer.

The dried film will be measured for Wf by Ultraviolet Photoelctron Spectroscopy (UPS). Wf energy level is usually determined from second electron cut-off with respect to the position of vacuum level using He I (21.22 eV) radiation.

Example 2

This example illustrates effect on work-function of the addition of Nafion® to a semiconductive oxide dispersion.

Nafion® is a trademark for poly(perfluoroethylenesulfonic acid) from E.I. du Pont de Nemours and Company.

General Procedure of Film Sample Preparation and Kelvin Probe Measurement

Film samples of Kelvin probe measurement for determination of work-function were made by spin-coating of a semiconductive dispersion or an admixture dispersion on 30 mm×30 mm glass/ITO substrates. ITO/glass substrates consist of 15 mm×20 mm ITO area at the center having ITO thickness of from 100 to 150 nm. At one corner of 15 mm×20 mm ITO area, ITO film surface extended to the edge of the glass/ITO serves as electrical contact with Kelvin probe electrode. Prior to spin coating, ITO/glass substrates were cleaned and the ITO sides were subsequently treated with UV-ozone for 10 minutes. Once spin-coated, the deposited materials on the corner of the extended ITO film were removed with a Q-tip wetted with ether water. The exposed ITO pad was for making contact with Kelvin probe electrode. The deposited films were then baked as illustrated in Examples. The baked film samples were then placed on a glass jug flooded with nitrogen before capped with a lid before measurement.

For work-function determination, an ambient-aged gold film was measured first as a reference prior to measurement of samples. The gold film on a same size of glass piece was placed in a cavity cut out at the bottom of a square steel container. On the side of the cavity, there are four retention clips to keep sample piece firmly in place. One of the retention clips is attached with electrical wire for making contact with the Kelvin probe. The gold film was facing up while a Kelvin probe tip protruded from the center of a steel lid was lowered to above the center of the gold film surface. The lid was then screwed tightly onto the square steel container at four corners. A side port on the square steel container was connected with tubing for allowing nitrogen to sweep the Kelvin probe cell continuously while a nitrogen exit port capped with a septum in which a steel needle is inserted for maintaining ambient pressure. The probe settings were then optimized for the probe and only height of the tip was changed through entire measurement. The Kelvin probe was connected to a McAllister KP6500 Kelvin Probe meter having the following parameters: 1) frequency: 230; 2) amplitude: 20; 3) DC offset: varied from sample to sample; 4) upper backing potential: 2 volt; 5) lower backing potential: −2 volt; 6) scan rate: 1; 7) trigger delay: 0; 8) acquisition(A)/data(D) points:1024; 9) A/D rate: 12405 @19.0 cycles; 10) D/A: delay: 200; 11) set point gradient: 0.2; 12) step size: 0.001; 13) maximum gradient deviation: 0.001. As soon as the tracking gradient stabilized, the contact potential difference ("CPD") in volt between gold film was recorded. The CPD of gold was then referencing the probe tip to (4.7-CPD) eV. The 4.7 eV (electron volt) is work-function of ambient aged gold film surface [Surface Science, 316, (1994), P380]. The CPD of gold was measured periodically while CPD of samples were being determined. Each sample was loaded into the cavity in the same manner as gold film sample with the four retention clips. On the retention clip making electrical contact with the sample care was taken to make sure good electrical contact was made with the exposed ITO pad at one corner. During the CPD measurement a small stream of nitrogen was flowed through the cell continuously without disturbing the probe tip. Once CPD of sample was recorded, the sample workfunction or energy potential was then calculated by adding CPD of the sample to the difference of 4.7 eV and CPD of gold.

In this example, Celnax CX-Z300H used for illustration was also purchased from Nissan Chemical Industries, LTD from Houston, Tex. The Celnax is antimony double oxide (antimony zirconate) hydrosol, which was determined to contain 27.05% (w/w) oxide and the rest is water. It has pH 6.9 and particle size of 20 nm using BET method. To determine work-function of the semiconductive oxide film, a diluted CX-Z300H was made by mixing 5.004 g of the hydrosol with 13.828 g deionized water. The diluted sample contains only 7.19% (w/w) oxide. It was spin-coated at a speed of 1,800 rpm for 60 seconds on one of the ITO substrates described in the general procedure of film sample preparation. The zinc/antimony double oxide film on the ITO/glass substrate was then baked at 130° C. in air for 10 minutes. Prior to Kelvin probe measurement of the oxide film sample, a gold film was measured first. Contact potential difference (CPD) between gold film and the Kelvin probe tip is 0.663 volt. CPD between the oxide film and Kelvin probe tip was determined to be 0.87 volt. Work-function of the antimony oxide surface was therefore calculated to be 4.91 eV using 4.7 eV for work-function of air-aged gold. This work-function (Wf) data is listed in Table 1 as a control to determine effect of addition of Nafion® on its work-function.

Nafion® used for addition to CX-Z300H has an EW of 1000 and was made using a procedure similar to the procedure in U.S. Pat. No. 6,150,426, Example 1, Part 2, except that the temperature is approximately 270° C. As made Nafion® is at 25% (w/w) in water. The 25% dispersion was first diluted to 12% before use. The general procedure for making the mixture was to add the Nafion® to CX-Z300H which was diluted with water first. Final solid concentration was aimed at about 7.2% (w/w) in water, but the ratio of acid-equivalent/1 g double oxide was kept at five different levels. For the example of $5.0 \times 10^{-4}$ acid-equivalent/1 g antimony/zinc oxide, 5.0091 g CX-Z300H was added with 17.6691 g deionized water. It was stirred with a roller and then added with 5.6859 g Nafion®. The final solid concentration is 7.18% and the acid-equivalent/1 g oxide is $5.0 \times 10^{-4}$. Each dispersion sample listed in Table 1 was made in the same manner and was filtered through a 0.45 μm HV filter onto an ozone-treated ITO substrate for spin-coating at 1,800 RPM for 60 seconds. The spin-coated films were then baked at 130° C. in air for 10 minutes and measured for contact potential difference with Kelvin probe. Table 1 clearly shows that work-function of antimony/zinc double oxide film surface is low, but increases as Nafion® is added to CX-Z300H. High work-function is critical for OLEDs as a buffer layer for device function.

TABLE 1

Effect of acid (Nafion ®) equivalent/1 gram-oxide on work-function (Wf)

| Acid equivalent./1 g oxide | CPD (volt) | Wf (eV, ref. To Au) |
|---|---|---|
| 0 | 0.87 | 4.91 |
| $1 \times 10^{-4}$ | 1.02 | 5.06 |
| $2.6 \times 10^{-4}$ | 1.37 | 5.41 |
| $5.0 \times 10^{-4}$ | 1.60 | 5.64 |
| $7.2 \times 10^{-4}$ | 1.77 | 5.81 |
| $2.5 \times 10^{-3}$ | 1.99 | 6.03 |

Example 3

This example illustrates the effect of the addition of Poly (VF2/PSEBVE) to a semiconductive oxide dispersion on its work-function.

In this example, Celnax CX-Z300H was also used to determine effect of poly(VF2/PSEBVE) on work-function of zinc/ antimoney double oxide. Synthesis of of Poly(VF2/PSE-BVE) was illustrated later in this example. The procedure described in Example 2 for film preparation of zinc/antimony oxide, and its admixture with Poly(VF2/PSEBVE), and contact potential difference measurement for determination of work-function was closely followed. The work-function data listed in Table 2 clearly shows that work-function of antimony/zinc double oxide film surface is low, but increase as Nafion® is added to CX-Z300H. High work-function is critical for OLEDs as a buffer layer for device function.

Poly(VF2/PSEBVE) used for adding to Celnax CX-Z300H was made as follows.

a) Synthesis of an organic solvent wettable Poly(VF2/PSE-BVE) of 1,1-difluoroethylene ("VF2") and 2-(1,1-difluoro-2-(trifluoromethyl)allyloxy)-1,1,2,2-tetrafluoroethanesulfonyl fluoride ("PSEBVE"):

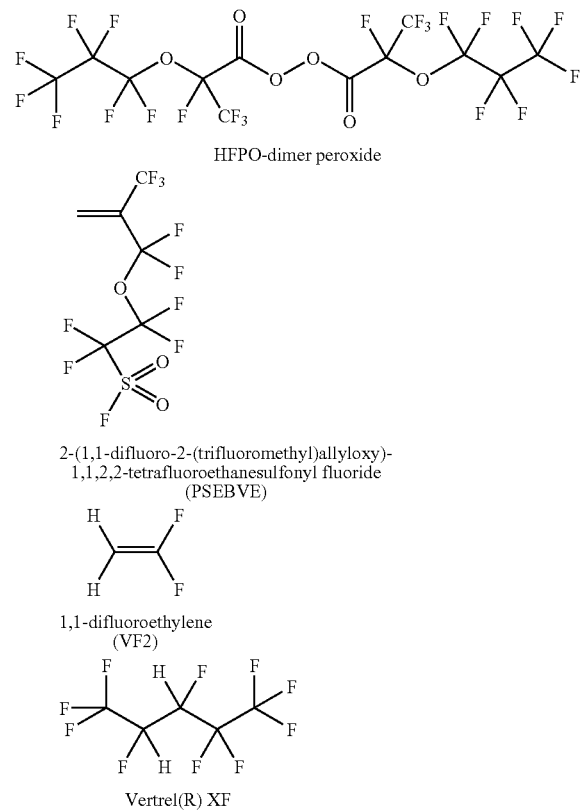

A 400 mL Hastelloy C276 reaction vessel was charged with 160 mL of Vertrel® XF, 4 mL of a 20 wt. % solution of HFPO dimer peroxide in Vertrel® XF, and 143 g of PSEBVE (0.42 mol). The vessel was cooled to −35° C., evacuated to −3 PSIG, and purged with nitrogen. The evacuate/purge cycle was repeated two more times. To the vessel was then added 29 g $VF_2$ (0.45 mol). The vessel was heated to 28° C., which increased the pressure to 92 PSIG. The reaction temperature was maintained at 28° C. for 18 h. at which time the pressure had dropped to 32 PSIG. The vessel was vented and the crude liquid material was recovered. The Vertrel® XF was removed in vacuo to afford 110 g of desired copolymer.

b) Conversion of the sulfonyl fluoride copolymer prepared above to sulfonic acid:

20 g of dried polymer and 5.0 g lithium carbonate were refluxed in 100 mL dry methanol for 12 h. The mixture was brought to room temperature and filtered to remove any remaining solids. The methanol was removed in vacuo to isolate the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven.

Films made from $VF_2$-PSEBVE acid are wettable by organic solvents. Phenylhexane will have a contact angle less than 40° on the films.

TABLE 2

Effect of acid [poly(VF2/PSEBVE)] equivalent/gram-oxide on work-function

| Acid equivalent/1 g oxide | CPD | Wf (eV, ref. To Au) |
| --- | --- | --- |
| 0 | 0.87 | 4.91 |
| $1.0 \times 10^{-4}$ | 1.29 | 5.34 |
| $2.5 \times 10^{-4}$ | 1.56 | 5.61 |
| $5.0 \times 10^{-4}$ | 1.79 | 5.84 |
| $1.0 \times 10^{-3}$ | 1.98 | 6.06 |
| $1.7 \times 10^{-3}$ | 2.06 | 6.13 |

Example 4

This example illustrates the effect of the addition of Poly(E/PSEPVE) to a semicondutive oxide dispersion on its work-function. In this example, Celnax CX-Z300H was also used to determine effect of poly(E/PSEPVE) on work-function of zinc/antimoney double oxide. Synthesis of of Poly(E/PSEPVE) was described later in this example. The procedure described in Example 2 for film preparation of zinc/antimony oxide, and its admixture with Poly(E/PSEPVE), and contact potential difference measurement for determination of work-function was closely followed. The work-function data listed in Table 3 clearly shows that addition of Poly(E/PSEPVE) to CX-Z300H has enhanced work-function of antimony/zinc double oxide. High work-function is critical for OLEDs as a buffer layer for device function.

Poly(E/PSEPVE) used for adding to Celnax CX-Z300H was made as follows.

a) Synthesis of an organic solvent wettable Poly(E/PSEPVE) of ethylene ("E") and 2-(2-(1,2,2-trifluorovinyloxy)-1,1,2,3,3,3-hexafluoropropoxy)-1,1,2,2-tetrafluoroethanesulfonyl fluoride ("PSEPVE"):

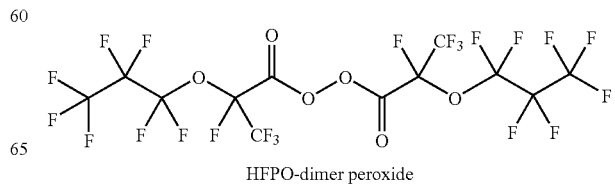

HFPO-dimer peroxide

-continued

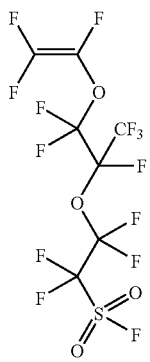

2-(2-(1,2,2-trifluorovinyloxy)-1,1,2,3,3,3-hexafluoropropoxy)-
1,1,2,2-tetrafluoroethanesulfonyl fluoride
or
Perfluoro-2-(2-fluorosulfonylethoxy)propylvinylether, (PSEPVE)

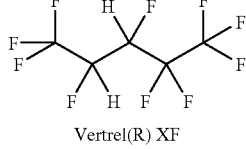

Vertrel(R) XF

A 210 mL Hastelloy C276 reaction vessel was charged with 60 g of PSEPVE (0.13 mol) and 1 mL of a 0.17 M solution of HFPO dimer peroxide in Vertrel® XF. The vessel was cooled to −35° C., evacuated to −3 PSIG, and purged with nitrogen. The evacuate/purge cycle was repeated two more times. To the vessel was then added 20 g ethylene (0.71 mol) and an additional 900 PSIG of nitrogen gas. The vessel was heated to 24° C., which increased the pressure to 1400 PSIG. The reaction temperature was maintained at 24° C. for 18 h. at which time the pressure had dropped to 1350 PSIG. The vessel was vented and 61.4 g of crude material was recovered. 10 g of this material were dried at 85° C. and 20 milliTorr for 10 h. to give 8.7 g of dried polymer.

b) Conversion of the sulfonyl fluoride copolymer prepared above to sulfonic acid:

A mixture of 19.6 g of dried polymer and 5.6 g lithium carbonate were refluxed in 300 mL dry methanol for 6 h. The mixture was brought to room temperature and filtered to remove any remaining solids. The methanol was removed in vacuo to afford 15.7 g of the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven.

Films made from E-PSEPVE acid are wettable by organic solvents. Phenylhexane will have a contact angle less than 40° on the films.

Example 5

This example illustrates the effect of the addition of Poly (NBD/PSEPVE) to a semiconductive oxide dispersion on its work-function.

In this example, Celnax CX-Z300H was also used to determine effect of poly(NBD/PSEPVE) on work-function of zinc/antimoney double oxide. Synthesis of of Poly(NBD/PSEPVE) was described later in this example. The procedure described in Example 2 for film preparation of a mixture of zinc/antimony oxide and Poly(NBD/PSEPVE), and contact potential difference measurement for determination of work-function was closely followed. The work-function data listed in Table 3 clearly shows that addition of Poly(NBD/PSEPVE) to CX-Z300H has enhanced work-function of antimony/zinc double oxide. High work-function is critical for OLEDs as a buffer layer for device function.

Poly(NBD/PSEPVE) used for adding to Celnax CX-Z300H was made as follows.

a) Synthesis of 3,3,4-trifluoro-4-(perfluorosulfonylethoxy) tricyclo[4.2.1.0$^{2,5}$]-non-7-ene (NBD-PSEVE):

A 1000 mL Hastelloy C276 reaction vessel was charged with a mixture of 2,5-norbornadiene (98%, Aldrich, 100 g), and hydroquinone (0.5 g). The vessel was cooled to −6° C., evacuated to −20 PSIG, and purged with nitrogen. The pressure was again reduced to −20 PSIG and 2-(1,2,2-trifluorovinyloxy)-1,1,2,2-tetrafluoroethanesulfonyl fluoride (305 g) was added. The vessel was agitated and heated to 190° C. at which time the inside pressure was 126 PSIG. The reaction temperature was maintained at 190° C. for 6 h. The pressure dropped to 47 PSIG at which point the vessel was vented and cooled to 25° C.

The crude monomer was distilled using a spinning-band column (BP=110-120° C. @ 40 Torr, 2100 RPM) to afford 361 g of colorless liquid consisting of a mixture of isomers. The chemical structure was confirmed by both GCMS and $^{19}$F and $^1$H NMR. MS: m/e 372 (M$^+$), 353 (base, M$^+$-F), 289 (M$^+$-SO$_2$F), 173 (C$_9$H$_8$F$_3{}^+$).

b) Synthesis of a TFE and NBD-PSEVE sulfonyl fluoride copolymer:

A 400 mL pressure vessel was swept with nitrogen and charged with 74.4 g (0.20 mol) of NBD-PSEVE, 50 mL of Solkane 365 mfc (1,1,1,3,3-pentafluorobutane) and 0.80 g of Perkadox® 16N. The vessel was closed, cooled in dry ice, evacuated, and charged with 30 g (0.30 mol) of TFE. The vessel contents were heated to 50° C. and agitated for 18 hr as the internal pressure decreased from 194 psi to 164 psi. The vessel was cooled to room temperature and vented to one atmosphere. The vessel contents were added slowly to excess hexane. The solid was filtered, washed with hexane and dried in a vacuum oven at about 80° C. There was isolated 32.3 g of the white copolymer. Its fluorine NMR spectrum showed peaks at +44.7 (1F, SO$_2$F), −74 to −87 (2F, OCF$_2$), −95 to −125 (CF$_2$, 4F from NBD-PSEVE and 4F from TFE), −132.1 (1F, CF). From integration of the NMR, polymer composition was calculated to be 48% TFE and 52% NBD-PSEVE. GPC analysis: Mn=9500, Mw=17300, Mw/Mn=1.82. DSC: Tg at 207° C. Anal. Found: C, 33.83; H, 1.84; F, 45.57.

c) Hydrolysis of a TFE/NBD-PSEVE sulfonyl fluoride copolymer for conversion to acid copolymer:

22.53 g (48.5 mmoles —SO$_2$F) TFE/NBD-PSEVE were placed in a 1000 mL distillation flask. This flask was equipped with a magnetic stirrer, condenser and nitrogen inlet adapter. To the flask, 350 mL methanol/water mixture (1:1 v/v) and 19.24 g (200 mmoles) ammonium carbonate were added. The flask was then immersed in an oil bath heated to 75° C. for 24 hours. $^{19}$F-NMR shows the absence of ~δ40, indicating that the sulfonyl fluoride was hydrolyzed to below the detection limit.

The entire content (~376 g) of the hydrolyzed mixture was further treated for conversion to acid. 30 g protonic exchange resins were added to the mixture and left stirred for 1 hr. The resin was filtered and fresh 30 g acidic resins were added and left stirred for 15 hrs and filtered again. The filtrate was treated with fresh 20 g acidic resins for half an hour and again the filtrate was treated with fresh 30 g acidic resins for half an hour. The final filtrate was then placed in around bottom flask which was immersed in an oil bath heated to 60° C. Once two thirds of the content were removed through evaporation, the oil bath heat was turned off until the content became dried. Dried solid, which was yellowish, weighed 18.5 g.

A few pieces of the solid was dissolved in water which turned into acidic. A couple of drops of the solution were cast on a microscope slide. It formed a smooth continuous film. The film surface can be wetted easily with p-xylene, which is a common solvent for light emitting materials.

TABLE 3

Effect of acid ($5 \times 10^{-4}$ acid equivalent/1 gram-oxide on work-function

| Acid | CPD vs. Kelvin Probe Tip | Work-function (eV; ref. To Au) |
| --- | --- | --- |
| None (Zinc antimonate) | 0.87 | 4.91 |
| Poly(E/PSEPVE) | 1.51 | 5.64 |
| Poly(NBD/TFE-PSEPVE) | 1.42 | 5.54 |

Example 6

This example illustrates the effect of the addition of Nafion® dispersed in methanol to a semiconducive oxide dispersion on its work-function. Nafion® is a trademark for poly(perfluoroethylenesulfonic acid) from E.I. du Pont de Nemours and Company (Wilmington, Del., USA).

In this example, Celnax CX-Z641 M used for illustration was also purchased from Nissan Chemical Industries, LTD from Houston, Tex. The Celnax is antimony double oxide methanosol, which was determined to contain 61.4% (w/w) oxide and the rest is methanol. It has pH 8.2 and particle size of 20 nm by BET method. To determine work-function of the semiconductive oxide film, a diluted CX-Z641 M was made by mixing 14.1889 g of the methanosol with 70.2178 g methanol. The diluted sample contains only 10.03% (w/w) oxide. It was filtered through a 0.45 μm HV filter for spin-coating at a speed of 3,000 rpm for 60 seconds on one of the ITO substrates described in the general procedure of film sample preparation. The zinc/antimony double oxide film on the ITO/glass substrate was then baked at 110° C. for 10 minutes and the thickness of the film was determined to be 100 nm (nanometer). Prior to Kelvin probe measurement of the oxide film sample, a gold film was measured first. Contact potential difference (CPD) between gold film and the Kelvin probe tip is 0.615 volt. Contact potential difference between the oxide film and Kelvin probe tip was determined to be 0.549 volt. Work-function of the antimony oxide surface was therefore calculated to be 4.63 eV using 4.7 eV for work-function of air-aged gold. This work-function data is listed in Table 4 as a control to determine effect of addition of Nafion® on its work-function.

Nafion®/methanol dispersion used for adding to CX-Z641 M was made as follow. An aqueous Nafion® dispersion having EW of 1000 was made first using a procedure similar to the procedure in U.S. Pat. No. 6,150,426, Example 1, Part 2, except that the temperature is approximately 270° C. As made aqueous Nafion® dispersion was then freeze-dried to Nafion® solids. 10.5475 g of the freeze-dried Nafion® solids were mixed with 94.2821 g methanol to obtain 10.06% (w/w) Nafion® in methanol. 11.75 g of the methanol-diluted CX-Z641 M dispersion was mixed with 11.68 g of the 10.06% Nafion®/methanol dispersion. The resulting dispersion contains 10.04% (w/w) zinc-antimony oxide/Nafion® in Methanol and has a pH of 0.5. Portion of the dispersion was filtered through a 0.45 μm HV filter for spin-coating at a speed of 5,000 rpm for 60 seconds on one of the ITO substrates described in the general procedure of film sample preparation. The zinc/antimony double oxide film on the ITO/glass substrate was then baked at 110° C. in air for 10 minutes and the film thickness was determined to be 173 nm. Its work-function is listed in Table 4, which shows that Nafion® has enhanced antimony/zinc double oxide from 4.63 eV to 5.37 eV. High work-function is critical for OLEDs as a buffer layer for device function.

A portion of the Nafion®/zinc-antimony oxide/methanol dispersion was adjusted to pH 7.8 with aqueous NH4OH. The dispersion maintains its stability and baked film made from it still has work-function of 5.38 eV.

TABLE 4

Effect of Nafion ® on work-function of zinc/antimony double oxide

| Acid | CPD vs. Kelvin Probe Tip | Work-function (eV; ref. To Au) |
| --- | --- | --- |
| None (Zinc antimonate) | 0.549 | 4.63 |
| Nafion ® added (pH0.4 dispersion) | 1.282 | 5.37 |
| Nafion ® added first, NH4OH second (pH 7.8 dispersion) | 1.293 | 5.38 |

Comparative Example A

This example illustrates device performance of a polymeric light emitting diode on an antimony/zinc double oxide film without containing Nafion®.

The 10.03% (w/w) antimony/zinc double oxide in methanol produced semiconductive oxide films, which had work-function of 4.63 eV as illustrated in Example 6. The work-function is low and this comparative example is to demonstrate its device function as a buffer layer for a light emitting diode. The 10.03% (w/w) antimony/zinc double oxide in methanol prepared in Example 6 was filtered through 0.45 μm HV filter for spin-coating at a speed of 3,000 rpm for 60 seconds on glass/ITO backlight substrates (30 mm×30 mm) and baked at 130° C. in air for 15 minutes. Each ITO substrate having ITO thickness of 100 to 150 nm consists of 3 pieces of 5 mm×5 mm pixels and 1 piece of 2 mm×2 mm pixel for light emission. The baked zinc/antimony oxide films had thickness of 100 nm. The ITO/glass substrates containing the double oxide film were transferred into a glove box and 76 nm of Lumation Green K2 1303 [1% (w/v) in p-Xylene spun at 1,000 RPM] from Sumitomo Chemicals Company (Japan) were spun on top. The Green K2 layer was baked at 130° C. on a hot plate inside the glove box for 30 minutes before transfer into an evaporator and evaporation of 3 nm of Barium and 250 nm of Aluminum as cathode. Encapsulation was done by epoxy and a glass coverslip. The device had current efficiency less than 0.7 cd/A from above zero to 3,000 nits.

Example 7

This example illustrates the effect of the addition of Nafion® dispersed in methanol on the performance of a semiconductive oxide dispersion of a polymeric light emitting diode.

10.04% (w/w) zinc-antimony oxide/Nafion® in methanol produced semiconductive oxide films which had work-function of 5.37 eV. The work-function is much higher than that in comparative Example 1, where Nafion® was absent from the double oxide dispersion. This example demonstrates the films' device function as a buffer layer for a light emitting diode. The 10.04% (w/w) zinc-antimony oxide/Nafion® in methanol prepared in Example 6 was filtered through 0.45 μm HV filter for spin-coating at a speed of 5,000 rpm for 60 seconds on glass/ITO backlight substrates (30 mm×30 mm) and baked at 130° C. in air for 15 minutes. The remaining fabrication of the devices was carried out in the same manner as described in Comparative Example 1. The device had current efficiency 11 cd/A from above zero to 10,000 nits. This example clearly shows that addition of Nafion® to antimony-zinc oxide dispersion in methanol has enhanced their work-function and light emitting device performance as a buffer layer.

Comparative Example B

This comparative example illustrates device performance of a polymeric light diode on an antimony/zinc double oxide film without Nafion®.

In this comparative example, 5.99% antimony/zinc oxide dispersion in water was made by adding 19.3706 g deionized water to 5.5143 g CX-Z300H. The resulting dispersion has a pH of 8. The 5.99% (w/w) antimony/zinc double oxide in water was first determined to produce films which had work-function of 4.44 eV. The work-function is low and this comparative example demonstrates the device function as a buffer layer for a light emitting diode. The 5.99% antimony/zinc double oxide in water was also filtered through 0.45 μm HV filter for spin-coating at a speed of 3,000 rpm for 60 seconds on glass/ITO backlight substrates (30 mm×30 mm) and baked at 130° C. in air for 15 minutes. Each ITO substrate having ITO thickness of 100 to 150 nm consists of 3 pieces of 5 mm×5 mm pixels and 1 piece of 2 mm×2 mm pixel for light emission. The baked zinc/antimony oxide films had thickness of 35 nm. The ITO/glass substrates containing the double oxide film were transferred into a glovebox and 76 nm of Lumation Green K2 1303 [1% (w/v) in p-Xylene spun at 1,000 RPM] from Sumitomo Chemicals Company (Japan) were spun on top. The Green K2 layers were baked at 130° C. on a hot plate inside the glove box for 30 minutes before transfer into an evaporator and evaporation of 3 nm of Barium and 250 nm of Aluminum as cathode. Encapsulation was done by epoxy and a thin piece of glass lid. The device has current efficieny less than 0.5 cd/A from above zero to 3,000 nits. The device efficiency is too low to be useful.

Example 8

This example illustrates the effect of the addition of Nafion® dispersed in water on the performance of a semiconductive oxide dispersion of a polymeric light diode.

In this example, 7.2% antimony/zinc oxide/Nafion® dispersion in water was made by first adding 17.6348 g deionized water to 5.6559 g CX-Z300H. To the resulting dispersion was added 5.6559 g Nafion® (12%, w/w) dispersion described in Example 2. The resulting dispersion had a pH of 2.2. The 7.2% (w/w) antimony-zinc oxide/Nafion® in water was first determined to produce semiconductive films which had work-function of 5.23 eV. This work-function is much higher than that of the films produced from the composition without Nafion® in Comparative Example 2. This example demonstrates the device function as a buffer layer for a light emitting diode. The 7.2% antimony/zinc oxide/Nafion® dispersion was filtered through 0.45 μm HV filter for spin-coating at a speed of 1,800 rpm for 60 seconds on glass/ITO backlight substrates (30 mm×30 mm) and baked at 130° C. in air for 15 minutes. The baked zinc-antimony oxide/Nafion® films had thickness of 35 nm. The remaining fabrication of the devices was carried out in the same manner as described in Comparative Example 2. The device had current efficiency 11 cd/A from above zero to 10,000 nits. This example clearly shows that addition of Nafion® to antimony-zinc oxide dispersion in methanol enhanced its work-function and light emitting device performance as a buffer layer.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range subcombination.

What is claimed is:

1. A buffer composition consisting essentially of semiconductive oxide particles wherein the semiconductive oxide particles comprise a bimetallic oxide selected from indium-tin oxide ("ITO"), indium-zinc oxide ("IZO"), gallium-indium oxide, and zinc-antimony double oxide and a fluorinated acid polymer wherein the fluorinated acid polymer has a formula according to Formula XV:

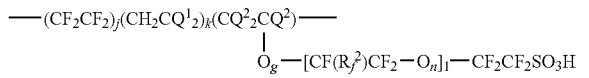

where $j \geqq 0$, $k \geqq 0$ and $4 \leqq (j+k) \leqq 199$, $Q^1$ and $Q^2$ are F or H, $R_f^2$ is F or a perfluoroalkyl radical having 1-10 carbon atoms either unsubstituted or substituted by one or more ether oxygen atoms, $h=0$ or 1, $i=0$ to 3, $g=0$ or 1, and $E^4$ is H or an alkali metal, wherein the buffer composition has a work-function greater than 5.0 eV.

2. An electric device comprising a buffer composition of claim 1.

* * * * *